United States Patent [19]

Healey, III

[11] 4,320,346

[45] Mar. 16, 1982

[54] LARGE DYNAMIC RANGE LOW DISTORTION AMPLITUDE MODULATION DETECTOR APPARATUS

[75] Inventor: Daniel J. Healey, III, Baltimore, Md.

[73] Assignee: The United States of America as represented by the Secretary of the Air Force, Washington, D.C.

[21] Appl. No.: 132,452

[22] Filed: Mar. 21, 1980

[51] Int. Cl.³ .............................................. H03D 1/10
[52] U.S. Cl. .................................. 329/101; 329/204; 329/206; 455/337
[58] Field of Search ........... 329/101, 203, 204, 205 R, 329/206; 455/337

[56] References Cited

U.S. PATENT DOCUMENTS

| | | | |
|---|---|---|---|
| 3,921,086 | 11/1975 | Marek | 329/204 |
| 4,000,472 | 12/1976 | Eastland et al. | 329/204 |

OTHER PUBLICATIONS

Equizabal, "Biasing the Diode Improves a-m Detector Performance", Electronics, Aug. 4, 1977, pp. 97, 99.

Primary Examiner—Siegfried H. Grimm
Attorney, Agent, or Firm—Donald J. Singer; William Stepanishen

[57] ABSTRACT

An amplitude modulation detection apparatus utilizing a balanced diode rectifier circuit to detect amplitude modulation on HF and VHF amplitude modulated carrier frequencies at rates approaching to the carrier frequency without diagonal clipping. A temperature compensating forward biasing supply circuit is connected to the rectifier circuit to supply thereto a forward bias potential that varies with temperature and a trickle current that remains substantially independent of temperature variation.

4 Claims, 3 Drawing Figures

LARGE DYNAMIC RANGE LOW DISTORTION AMPLITUDE MODULATION DETECTOR APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a modulation detection apparatus, and in particular to a large dynamic range, low distortion amplitude modulation detector apparatus.

In the prior art, amplitude modulation envelope detectors have been employed in electronic systems to obtain video bandwidth information frequencies as a linear function of the modulated carrier signal. Since the modulation bandwidth may be on the order of Mega-Hertz and in order to obtain the modulation waveform at the output of the detector with least distortion, the impedance which is acting as a load, is generally kept low to provide a wide video bandwidth. However, for small load impedances, low amplitude input signals to the detector become affected by the non-linear region of the operating characteristics of the detector components. Increasing the envelope detector drive level to remain above the component non-linear operating region creates the disadvantage of requiring high drive power requirements for the detector. Therefore, forward biasing of the detector components has been employed to improve the linearity of component operating characteristics at low input levels. However, the temperature drift component characteristics of these forward biased detectors resulted in an unstable offset voltage causing the loss of low level input signals.

An additional problem with the prior art detectors is the inability to accurately reproduce the envelope of the IF signal input. Particularly, when the rate of decrease of the IF envelope is much greater than the time constant of the envelope detector, the output from the detector will only be an approximation of the actually IF input signal. This is commonly referred to as diagonal clipping. Such diagonal clipping is particularly undesirable in high resolution radar application. Such behavior leads to modification of the waveform resulting from fluctuating large signals such as sea clutter in that fluctuations appear in range cells at the receiver output and are not present in those range cells in the IF signal of the receiver. A form of cross modulation, therefore, exists which degrades detection of desired signals against a clutter background.

SUMMARY OF THE INVENTION

The present invention utilizes an amplitude modulation detector having a pair of balanced diode rectifiers to detect amplitude modulation at rates approaching the carrier frequency without diagonal clipping. A forward biasing circuit provides a trickle current to the balanced diode circuit which improves rectification at very low levels and increases the detector linearity over a wide input signal range. The biasing circuit utilizes matched pairs of diodes and operational amplifiers that exhibit a stiff bias voltage which changes with temperature in order to stabilize the current in the balanced diode rectifiers. The IF input signals to the amplitude modulation detector are applied to a pair of microwave RF power transistors which are selected for suitability in wide band negative feedback amplifier use with attendant low distortion. The output signals from the transistors are coupled to the balanced diode rectifiers through a low leakage reactance transformer that supplies peak IF voltages to the diode rectifiers with negligible envelope distortion. The signals from the rectifying diodes are filtered by a low pass filter to suppress unwanted frequency components.

It is one object of the present invention, therefore, to provide an improved amplitude modulation detector apparatus having a large dynamic range and low distortion.

It is another object of the present invention to provide an improved amplitude modulation detector apparatus having a balanced pair of diode rectifier circuits providing an undistorted replica of the amplitude modulation of said carrier frequency signals.

It is another object of the present invention to provide an improved amplitude modulation detector apparatus having a forward biasing supply means for producing an essentially constant trickle current in each diode as function of ambient temperature variation.

It is another object of the present invention to provide an improved amplitude modulation detector apparatus having a means of establishing the required forward biasing potential such that the potential varies as a function of temperature in such a manner that the trickle current remains essentially independent of temperature.

It is another object of the present invention to provide an improved amplitude modulation detector apparatus having a means for achieving negligible diagonal clipping for modulation rates from zero frequency to a frequency approaching the carrier frequency.

It is another object of the present invention to provide an improved amplitude modulation detector apparatus having a means of providing a low impedance high AC voltage drive to the rectifiers to achieve greater linearity.

It is another object of the present invention to provide an improved amplitude modulation detector apparatus having a means of maintaining the potential required for trickle current constant as a function of the applied level of the AC signal to be rectified.

It is another object of the present invention to provide an improved amplitude modulation detector apparatus having a means of precisely separating the modulation spectrum from the unwanted signal spectrum present in the rectified signal current without introducing distortion of the modulation waveform.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
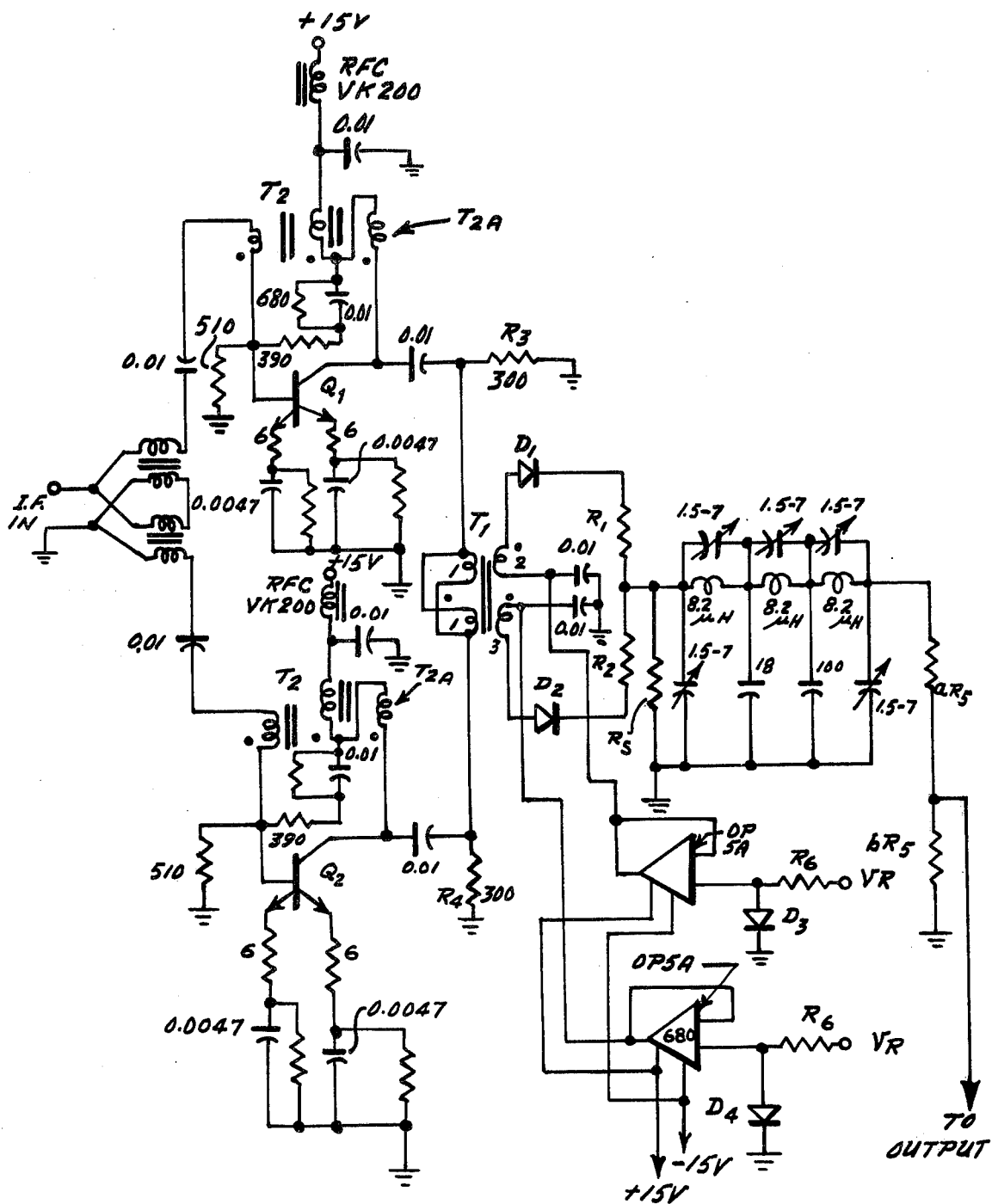
FIG. 1 is a schematic diagram of the amplitude modulation detector apparatus in accordance with the present invention.

Referring now to FIG. 1, there is shown an amplitude modulation detector apparatus having a pair of balanced half wave averaging rectifiers. Diodes D1 and D2 conduct on alternate cycles of the IF signal input thus providing half wave rectified waveforms at junction of D1 and R1, and D2 and R2. These signals are summed at the input to the low pass filter to provide an excitation that is similar to that obtained from a conventional full wave rectifier. The current waveform at the filter input then exhibits a Fourier transform similar to that exhibited by the output of a full wave rectifier driving a constant resistance load.

The present configuration provides a minimum of diagonal clipping since the recovery time at the cathodes of the diodes is fixed by the time constant of resistor R1 and the non-conducting capacitance (approximately 2 pF) of diode D1, and similar with resistor R2 and the capacitance of diode D2. Resistors R1 and R2 have been selected so that this time constant is less than 2.1 nanoseconds, thus permitting rate of change of the IF envelope over a 48 dB range in 22 nanoseconds (period of 45 MHz IF) to be reproduced without distortion due to diagonal clipping.

The low pass filter provides constant group delay to frequency beyond the 3 dB cutoff, and provides the Chebyshev behavior with attenuation peaks at the IF frequency and its harmonics, thus effectively suppressing unwanted frequency components appearing at the output that otherwise would affect operation of the digital signal processor driven by the envelope detector if they were not suppressed in this manner.

Transformer T1 is a low-leakage reactance transformer constructed using a two hole aperture (or balun) ferrite core. The volume of the core and material is selected so that peak IF voltages of 20 volts maximum can be developed at the input to each rectifier diode with negligible envelope distortion. Two conductor, No. 36 bonded parallel insulated wire is used for the transformer windings with wire interconnections such that leakage reactance between winding 2 and 3 is minimized.

The desired maximum linear IF voltage at winding 1 of T1 of 20 volts peak is achieved by a balanced feedback amplifier configuration incorporating lossy feedback via resistance that provides both voltage and current feedback in combination with lossless feedback via T2 which is employed to match the input impedance to 100 ohms at each transistor stage input. The 200 ohm total impedance is then matched to 50 ohms by utilizing a conventional wide band transmission line transformer T2A in which the windings surround the inner and outer portions of two hole aperture cores as opposed to ring toroid type construction.

Transistors Q1 and Q2 are microwave RF power transistors, such as TRW 54001 units which are selected so that a wide band negative feedback amplifier and its attendant low distortion can be actually realized at 45 MHz with signal voltages of 10 volts peak at each collector. The emitter biasing is via paralleled chip resistors to achieve the necessary low inductance in the emitter circuit which is necessary to obtain unconditional stability in the feedback amplifier. The use of the lossy voltage negative feedback results in a low dynamic impedance at the collectors. The equivalent generator that excites the primary of T1 is a very low impedance source which can develop 20 volts peak (40 volts peak to peak) across the primary of T1 at 45 MHz. The load driven by each of the transistors is essentially $R = R_1/2 = R_2/2$ due to the effective half wave rectification on alternate cycles of the IF waveform which is developed by transistor Q1 and Q2. Resistors R3 and R4 suppress any tendency toward UHF instability in transistors Q1 and Q2 arising from parasitic inductance and capacitance associated with the detector circuit driven by Q1 and Q2. The impedance seen as a source impedance by the low pass video filter is very well defined by virtue of the sequential switching action of diodes D1 and D2 and the resistance $R_1 = R_2$ plus the small fixed dynamic output impedance afforded by the negative feedback IF amplifier circuit acting in parallel with resistor R5 which is a swamping resistance. To achieve most linear operation this resistance is made as large as practical. The practical limit is set by the required video frequency bandwidth of the detector, and minimum practical shunt capacitance at input and output node of the low pass filter, and also realizable minimum distributed capacitance of the inductors.

The rectified output available at the diode cathode is approximately $$0.82 V/\pi \text{ (with IF frequency of 50 MHz)}$$

where V is the peak IF voltage with V=20 volts this yields approximately 5.2 volts at each diode. Since the outputs are effectively summed, the equivalent voltage is 10.4 volts typically. This voltage is reduced by factor $R_5/2$ $$\left( \frac{1}{R_1 + R_5/2} \right).$$

This is typically 0.285 yielding an output of 2.96 volts maximum. The output termination of the low pass filter is taken from a resistive voltage divider comprising aR5 and bR5 to reduce this maximum voltage to approximately 1.0 volt maximum which is maximum input voltage that can be accepted by A/D converters driven by the envelope detector.

The minimum output must be 48 dB below the maximum to satisfy the typical requirements for an envelope detector that drives an 8 bit A/D converter. At each rectifier this means the IF input voltage is a minimum of about 60 millivolts peak. Rectification with useful efficiency is only possible at such level if a trickle current is passed through diodes D1 and D2 to overcome the built-in potential implicit in the diode equation. A trickle current of 10 microamperes is desirable, and it is further desirable that the current be maintained constant with ambient temperature change.

Diode D1, D3 and diodes D2, D4 which are matched pairs of diodes, are 1N5711 devices. A 10 microampere dc current is set through diodes D2, D4 by means of voltage, $V_R$ and resistor R6. An extremely low offset operational amplifier (OP5A Precision Monolithics) is used as a voltage follower to derive the necessary biasing potential for diodes D1 and D2. Thus, if the current setting resistance for diodes D3 and D4 is made equal to the load dc resistance of diodes D1 and D2 with voltage VR adjusted to set the trickle current to appropriate value accurate temperature compensation for diodes D1 and D2 temperature dependence of current is achieved since the offset introduced by the amplifier OP5A over the temperature range is a second order effect. The arrangement eliminates the problems which are associated with prior temperature compensation circuits since a stiff bias voltage source exhibiting the requisite change with temperature necessary to stabilize current in diodes D1 and D2 with temperature is realized. The stiff supply is needed since the current that must flow through the bias voltage source without changing its voltage must range from 10 microamperes to 4.95 mA in producing the 48 dB linear range of operation.

Figure 2:
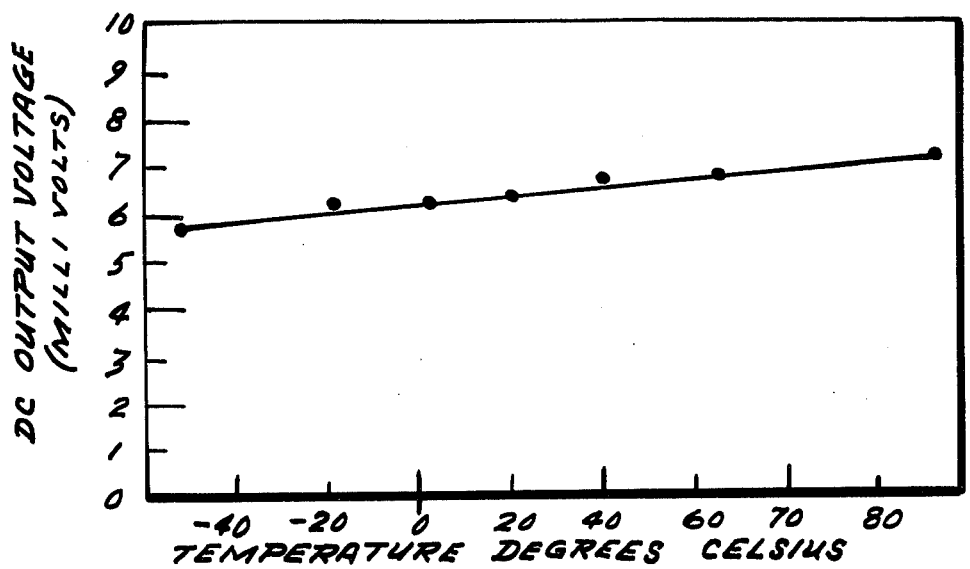
FIG. 2 is a graphical representation of the output from the detector apparatus versus temperature.

FIG. 2 shows the results of measurement of the circuit as described in this application. The use of only 20 volt peak at the rectifiers and a trickle current of $16 \times 10^{-6}$ amperes in each rectifier rather than $10 \times 10^{-6}$ amperes resulted in performance shown. The range of input signal over which deviation from linearity is less than 3 dB is approximately 45 dB. In the circuit tested, the 15 volt dc supply used to power an operational amplifier, OP5 and the transistor amplifiers was used to set the trickle current through a single series resistance rather than by varying voltage $V_R$ with resistance equal to the dc load connected to diodes D1 and D2. As a consequence of this and the fact that tests were made using operational amplifier OP5 rather than OP5A, the temperature tracking is a bit worse than would be obtained had an appropriate $V_R$ been employed.

Figure 3:
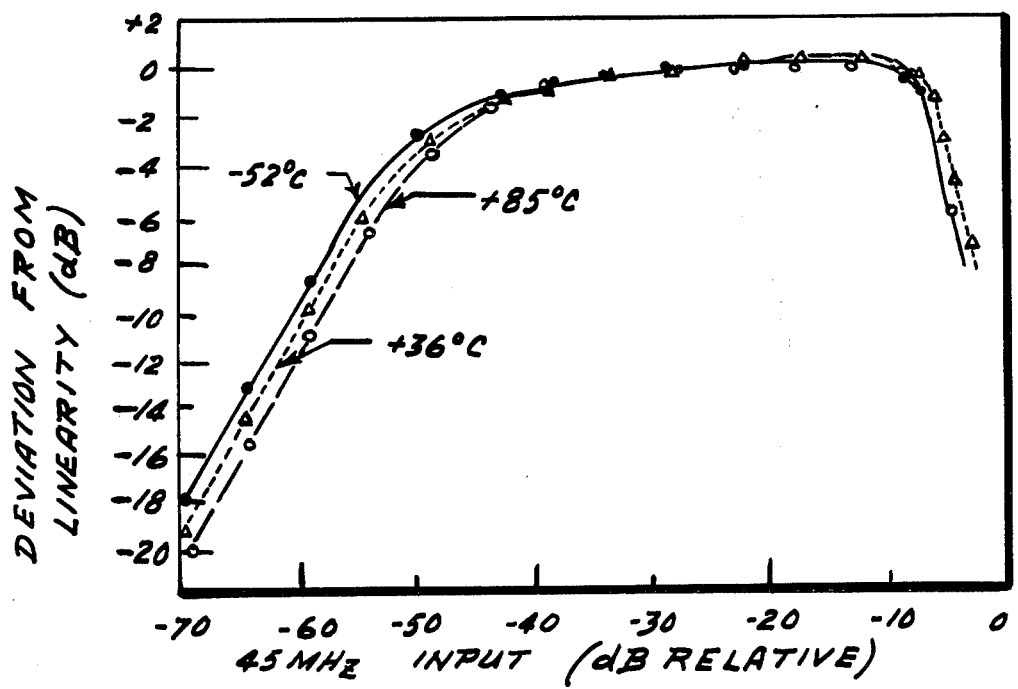
FIG. 3 is a graphical representation of the measured linearity characteristic of the detector apparatus.

FIG. 3 shows the output voltage variation with temperature when an input IF signal equivalent to the noise level of the receiver IF with no input signals at the radar antenna is applied to the inputs of transistors Q1 and Q2 input. Included in this characteristic then also is gain variation of Q1 and Q2 stages as function of temperature. The output ranges from 5.8 millivolts to 7.1 millivolts over $-55$ to $+85$ degree Celsius ambient temperature change. This is a 1.3 millivolt change. Maximum A/D input provided is 1 volt and the level shown then corresponds to an output that remains in range of one quanta. (Two quanta=7.8 mV, one quanta=3.9 mV).

Although the invention has been described with reference to a particular embodiment, it will be understood to those skilled in the art that the invention is capable of a variety of alternative embodiments within the spirit and scope of the appended claims.

What is claimed is:

1. An amplitude modulation detector apparatus comprising in combination:
    a power amplifier means to receive carrier frequency signals, said carrier frequency signals being amplitude modulated,
    an envelope detection means connected to said power amplifier means to receive said carrier frequency signals, said envelope detection means detecting said amplitude modulation, said envelope detection means having a recovery time rate of less than 2.1 nanoseconds, said envelope detection means providing an IF envelope signal,
    a forward biasing supply means connected to said envelope detection means to provide a trickle current thereto, said trickle current providing temperature compensation for said envelope detection means, said trickle current being substantially independent of temperature variation, and,
    a low pass filter means connected to said envelope detection means to receive said IF envelope signal, said low pass filter means filters said IF envelope signal to suppress unwanted frequency components, said low pass filter means providing a constant group delay to IF frequencies beyond the 3 db cutoff point, said low pass filter means providing Chebyshev behavior with attenuation peaks at the IF frequency and its harmonics.

2. An amplitude modulation detector apparatus as described in claim 1 wherein said envelope detection means comprises a pair of balanced half wave averaging diode rectifiers to provide an undistorted replica of said amplitude modulation of said carrier frequency signals.

3. An amplitude modulation detector apparatus as described in claim 1 wherein said forward biasing supply means comprises a pair of operational amplifiers, each having an extremely low offset voltage, said pair of operational amplifiers operating as voltage followers, the output from said pair of operational amplifiers respectively providing the biasing potential for said envelope detection means, each of said pair of operational amplifiers having an input biasing circuit comprising a series input resistor with a diode having its anode connected to the junction of the input resistor and operational amplifier and having its cathode connected to ground.

4. An amplitude modulation detector apparatus as described in claim 2 wherein said pair of diode rectifiers are respectively connected in series with a resistor to provide a time constant of less than 2.1 nanoseconds, said IF envelope signals being summed at the input of said low pass filter means.

* * * * *